(12) United States Patent
Li et al.

(10) Patent No.: US 7,138,680 B2
(45) Date of Patent: Nov. 21, 2006

(54) MEMORY DEVICE WITH FLOATING GATE STACK

(75) Inventors: Hong-Jyh Li, Austin, TX (US); Mark Gardner, Cedar Creek, TX (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/940,513

(22) Filed: Sep. 14, 2004

(65) Prior Publication Data

US 2006/0054943 A1    Mar. 16, 2006

(51) Int. Cl.
H01L 29/788    (2006.01)

(52) U.S. Cl. .............. 257/315; 438/257; 438/261; 257/E29.129

(58) Field of Classification Search ........... 438/257, 438/261, 264; 257/315, E29.129
See application file for complete search history.

(56) References Cited

U.S. PATENT DOCUMENTS

| | | | |
|---|---|---|---|
| 5,897,354 A * | 4/1999 | Kachelmeier | ........... 438/264 |
| 6,407,435 B1 | 6/2002 | Ma et al. | |
| 6,617,639 B1 * | 9/2003 | Wang et al. | ........... 257/324 |
| 6,627,494 B1 * | 9/2003 | Joo et al. | ........... 438/240 |
| 6,627,503 B1 | 9/2003 | Ma et al. | |
| 6,642,573 B1 | 11/2003 | Halliyal et al. | |
| 6,660,660 B1 | 12/2003 | Haukka et al. | |
| 6,674,138 B1 | 1/2004 | Halliyal et al. | |
| 6,693,051 B1 | 2/2004 | Muller et al. | |
| 6,750,066 B1 | 6/2004 | Cheung et al. | |
| 6,754,108 B1 | 6/2004 | Forbes | |
| 2004/0036111 A1 * | 2/2004 | Nishikawa et al. | ........... 257/316 |
| 2004/0051134 A1 | 3/2004 | Jang et al. | |
| 2005/0157549 A1 * | 7/2005 | Mokhlesi et al. | ...... 365/185.01 |

\* cited by examiner

Primary Examiner—Trung Dang
(74) Attorney, Agent, or Firm—Dicke, Billig & Czaja, PLLC

(57) ABSTRACT

A memory device comprises a substrate including isolation regions and active regions, and a floating gate stack proximate the substrate. The floating gate stack comprises a first high-k dielectric layer proximate the substrate, a first metal layer proximate the first high-k dielectric layer, and a second high-k dielectric layer proximate the first metal layer. The memory device comprises a control gate electrode proximate the floating gate stack.

36 Claims, 8 Drawing Sheets

MEMORY DEVICE WITH FLOATING GATE STACK

CROSS-REFERENCE TO RELATED APPLICATIONS

This application is related to U.S. patent application Ser. No. 10/799,910, filed March 12, 2004, and U.S. patent application Ser. No. 10/940,055, filed Sep. 14, 2004, which are both incorporated herein by reference.

BACKGROUND

As metal-oxide semiconductor field effect transistor (MOSFET) devices continue to advance, the thickness of the gate dielectric continues to decrease to maintain the desired control of the MOSFET devices. According to the International Technology Roadmap for Semiconductors (ITRS), an equivalent oxide thickness (EOT) of less than 15 Å is necessary to meet the requirement of sub-100 nm MOSFET devices. Using conventional $SiO_2$ as the gate material, it is difficult to keep scaling the thickness below 20 Å without having high tunneling leakage current through the gate. Thus, various other gate dielectric materials having a higher dielectric constant (k) than $SiO_2$ have been studied extensively. These materials are known as high-k materials. $SiO_2$ has a k value of 3.9 while the various other gate dielectric materials being studied have k values in the range of 10 to 80.

The thickness of the gate dielectric required to control a MOSFET depends on the capacitance of the film. High-k material films and the thicknesses that would result may be compared to other high-k materials and $SiO_2$ using equivalent oxide thickness (EOT). For example, a high-k film with a k value of 20 may be about five times thicker than a $SiO_2$ film and still have the same control over a MOSFET. The thicker gate dielectric layer may reduce tunneling leakage current through the gate, enabling sub-100 nm MOSFET devices.

Flash electrically-erasable programmable read-only memory (EEPROM) uses MOSFET technology and suffers from the same tunneling leakage current through the gate as the flash EEPROM memory cells are scaled in size. In operation, electrons in flash EEPROM memory cells are injected by tunneling into a floating gate to cause a threshold voltage shift that can be detected via current sensing. The magnitude of the threshold shift is related to the charge in the floating gate, the thickness of the control oxide, and other device parameters.

SUMMARY

One embodiment of the present invention provides a memory device. The memory device comprises a substrate including isolation regions and active regions, and a floating gate stack proximate the substrate. The floating gate stack comprises a first high-k dielectric layer proximate the substrate, a first metal layer proximate the first high-k dielectric layer, and a second high-k dielectric layer proximate the first metal layer. The memory device comprises a control gate electrode proximate the floating gate stack.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
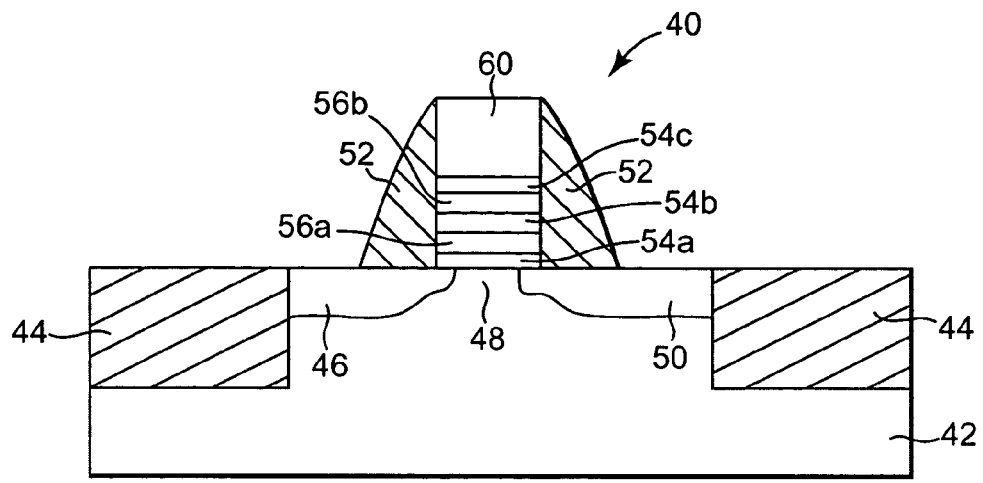
FIG. 1 is a diagram illustrating a cross-section of one embodiment of a semiconductor memory cell, according to the present invention.

FIG. 1 is a diagram illustrating a cross-section of one embodiment of a semiconductor memory cell 40, according to the present invention. Memory cell 40 is one of a plurality of memory cells in a flash electrically-erasable programmable read-only memory (EEPROM). Memory cell 40 includes substrate 42, isolation regions 44, source 46, channel 48, and drain 50. In one embodiment, memory cell 40 also includes a first dielectric layer 54a, a first metal layer 56a, a second dielectric layer 54b, an optional second metal layer 56b, an optional third dielectric layer 54c, a control gate electrode 60, and spacers 52. Dielectric layers 54 and metal layers 56 form a floating gate stack.

In one embodiment, dielectric layers 54 comprise high-k dielectric layers. Using high-k materials for dielectric layers 54 improves the high-k quality for dielectric layers 54 and provides an equivalent oxide thickness (EOT) that allows increased performance and reduced memory cell 40 size while not increasing tunneling leakage current through the gates. Tunneling leakage current through the gates is kept to a desired level as high-k materials improve control over memory cell 40. The improved control comes without reducing the thickness of dielectric layers 54, as required if using $SiO_2$ for dielectric layers 54.

Substrate 42 is a silicon substrate or other suitable substrate. Isolation regions 44 are trenches etched into substrate 42 that have been filled with an insulating material, such as $SiO_2$ or other suitable insulator with a dielectric constant less than four, to insulate memory cell 40 from adjacent memory cells. Source 46 and drain 50 are doped, for example, with arsenic, phosphorous, boron or other suitable material, depending upon the desired memory cell 40 characteristics, using a self-aligning ion implantation process in substrate 42 or other suitable process. Channel 48 is between source 46 and drain 50.

In one embodiment, first dielectric layer 54a is centered over channel 48 and can include $SiO_2$, SiON, or other suitable material based upon the type of pre-gate treatment performed on substrate 42. In one embodiment, a pre-gate treatment that results in no pre-gate material layer is used. Where the pre-gate treatment results in no pre-gate material layer, first dielectric layer 54a includes a high-k dielectric material, such as $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST $(Ba_{(a-x)}Sr_xTiO_3)$, PST $(PbSc_xTa_{(1-a)}O_3)$, PZN $(PbZn_xNb_{(1-x)}O_3)$, PZT $(PbZr_xTi_{(1-x)}O_3)$, PMN $(PbMg_xNb_{(1-x)}O_3)$, combinations of these high-k materials, combinations of these high-k materials and their nitrided forms, or other suitable high-k materials or combinations. In another embodiment, first dielectric layer 54a includes a combination of a pre-gate treatment material, such as $SiO_2$ or SiON, and a high-k material. First dielectric layer 54a provides the tunneling dielectric for memory cell 40.

First metal layer 56a is deposited on first dielectric layer 54a and includes TiN, HfN, TaN, ZrN, LaN, combinations of TiN, HfN, TaN, ZrN, LaN, or another suitable material or combination of materials. First metal layer 56a provides a first floating gate electrode for memory cell 40.

Second dielectric layer 54b is deposited on first metal layer 56a and includes a high-k dielectric material, such as $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, PMN, combinations of these high-k materials, combinations of these high-k materials and their nitrided forms, or other suitable high-k materials or combinations.

Second metal layer 56b is deposited on second dielectric layer 54b and includes TiN, HfN, TaN, ZrN, LaN, combinations of TiN, HfN, TaN, ZrN, LaN, or another suitable material or combination of materials. Second metal layer 56b provides a second floating gate electrode for memory cell 40.

Third dielectric layer 54c is deposited on second metal layer 56b and includes a high-k dielectric material, such as $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, PMN, combinations of these high-k materials, combinations of these high-k materials and their nitrided forms, or other suitable high-k materials or combinations.

In other embodiments, dielectric layers 54 and metal layers 56 are repeated as many times as desired to achieve desired memory cell 40 characteristics. In one embodiment, each additional metal layer 56 increases the charge stored in memory cell 40.

Control gate electrode layer 60 is deposited on third dielectric layer 54c and can include aluminum, polysilicon, or other suitable conductive material. Spacers 52 are deposited on the sides of gate electrode layer 60, dielectric layers 54, metal layers 56, and substrate 42 and can include $SiO_2$, $Si_3N_4$, TEOS or other suitable dielectric material. Spacers 52 isolate control gate electrode 60, dielectric layers 54, and metal layers 56 from source 46 and drain 50.

In operation, electrons in flash EEPROM memory cell 40 are injected by tunneling into metal layers 56a and 56b to cause a threshold voltage shift that can be detected via current sensing. The magnitude of the threshold shift is related to the charge in metal layers 56a and 56b, the thickness of dielectric layers 54a and 54b, and other memory cell 40 parameters.

Of the high-k materials, $HfO_2$ films are compatible with both polysilicon and metal gate electrodes. $HfO_2$, however, has a low immunity to oxygen and boron diffusion. Incorporating N or another suitable species into $HfO_2$ films reduces impurity diffusion, increases crystallization temperature, improves thermal stability, etc.

In one embodiment, dielectric layers 54 are incorporated with N using the process described in U.S. patent application Ser. No. 10/940,955. N is incorporated into dielectric layers 54 by depositing alternating layers of a high-k dielectric material and a metal containing N, or by simultaneously depositing the high-k dielectric material and the metal. After depositing the materials, the materials are annealed to oxidize the metal and to form a mixture of the high-k material and the metal containing N that results in a dielectric layer having a k value greater than the k values of each individual material in the mixture.

FIGS. 2–14 are diagrams illustrating an exemplary process for fabricating one embodiment of memory cell 40. In the exemplary process, memory cell 40 is fabricated from substrate 42, dielectric layers 54, metal layers 56, gate electrode 60, and spacers 52.

Figure 2:
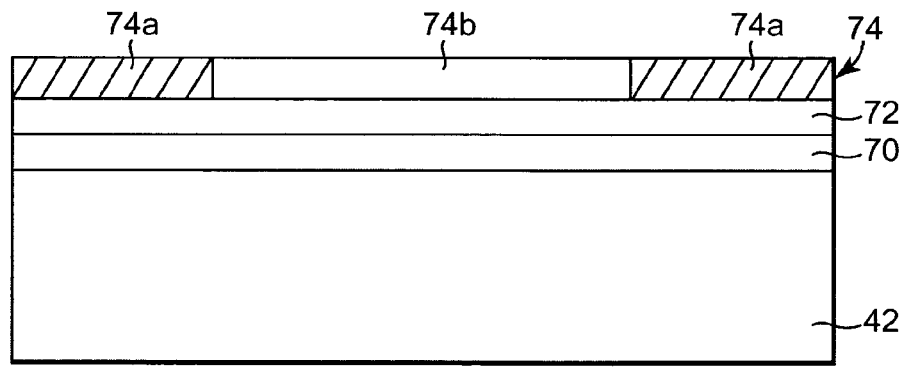
FIG. 2 is a diagram illustrating a cross-section of one embodiment of a photoresist layer, a nitride layer, an oxide layer, and a substrate.

FIG. 2 is a diagram illustrating a cross-section of one embodiment of a photoresist layer 74, a nitride layer 72, an oxide layer 70, and substrate 42. Isolation regions 44 can be formed using a shallow trench isolation (STI) process. Oxide layer 70 is formed on substrate 42. Nitride layer 72 is formed on oxide layer 70, and photoresist layer 74 is formed on nitride layer 72.

Oxide layer 70 is grown or deposited on silicon substrate layer 42. Nitride layer 72 is deposited on oxide layer 70 using chemical vapor deposition (CVD) or other suitable deposition method. Photoresist layer 74 is spin-coated on nitride layer 72. A mask is used to expose portions 74a of photoresist layer 74 and prevent portions 74b of photoresist layer 74 from being exposed. Photoresist layer 74 is exposed to high intensity ultra-violet (UV) light through the mask to expose portions 74a of photoresist layer 74. Portions 74a of photoresist layer 74 define where isolation regions 44 will be formed in substrate 42.

The exposed portions 74a of photoresist are removed to leave unexposed portions 74b of photoresist on nitride layer 72. The newly exposed nitride layer 72 portions, the oxide layer 70 portions beneath the newly exposed nitride layer 72 portions, and portions of substrate 42 beneath the newly exposed nitride layer 72 portions are etched away using wet etching, dry etching, or other suitable etching process. After etching, the newly formed trenches are filled with oxide using chemical vapor deposition (CVD) or other suitable deposition technique.

Figure 3:
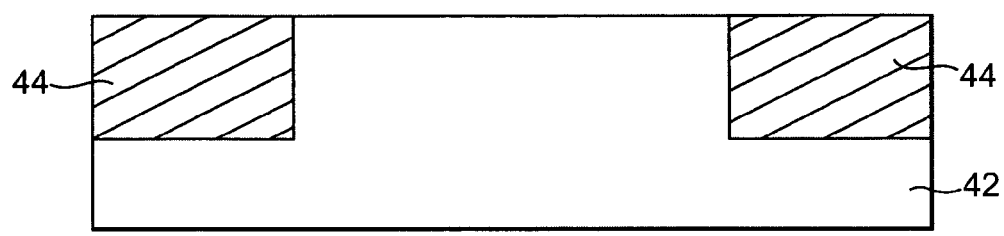
FIG. 3 is a diagram illustrating a cross-section of one embodiment of a substrate including isolation regions.

FIG. 3 is a diagram illustrating a cross-section of one embodiment of substrate 42 with isolation regions 44 formed in the substrate from the etching process previously described and illustrated in FIG. 2. In addition, the remaining nitride layer 72 and oxide layer 70 are removed from substrate 42. Depending upon the desired characteristics for the memory cell device, substrate 42 can be implanted to form n-wells and/or p-wells and $V_{tn}$ and/or $V_{tp}$ adjust implants can be performed.

Figure 4:
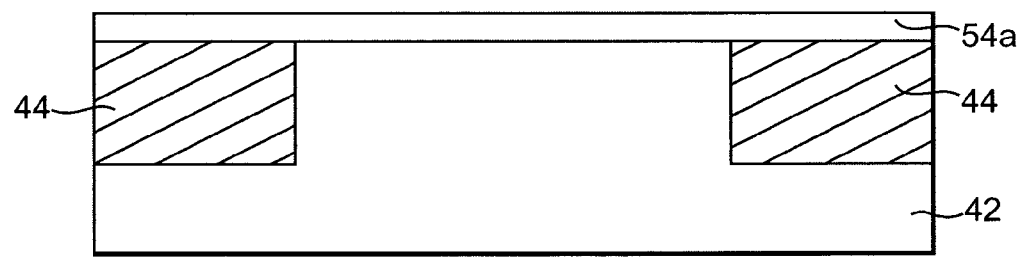
FIG. 4 is a diagram illustrating a cross-section of one embodiment of a substrate with isolation regions and a first dielectric layer.

FIG. 4 is a diagram illustrating a cross-section of one embodiment of substrate 42 with isolation regions 44 and a first dielectric layer 54a. A pre-gate treatment is used to clean and treat the surface of substrate 42. In one embodiment, the pre-gate treatment leaves first dielectric layer 54a including $SiO_2$, SiON, or other material based upon the pre-gate treatment used. In one embodiment, the pre-gate treatment of substrate 42 does not leave a pre-gate material on substrate 42. In this case, a high-k material is deposited on substrate 42 for first dielectric layer 54a. First dielectric layer 54a is deposited on substrate 42 using atomic layer deposition (ALD), metal-organic chemical vapor deposition (MOCVD), plasma vapor deposition (PVD), jet vapor deposition (JVD), or other suitable deposition technique. In one embodiment, first dielectric layer 54a includes a combination of a pre-gate treatment material, such as $SiO_2$ or SiON, and a high-k material.

In another embodiment, first dielectric layer 54a comprises a mixture of one or more high-k materials. The mixture can comprise two or more of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{L2}$, $WO_3$, $Y_2O_3$, $LaAlO_3$, BST, PST, PZN, PZT, PMN, and the nitrided forms of these high-k materials, such as TiN, HfN, TaN, ZrN, and LaN. The mixture is formed using the method described in U.S. patent application Ser. No. 10/940,055. In one embodiment, first dielectric layer 54a has a thickness within the range of 1 Å to 50 Å.

Figure 5:
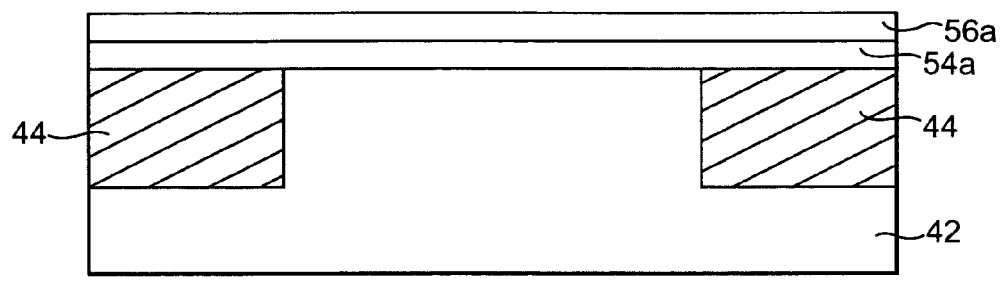
FIG. 5 is a diagram illustrating a cross-section of one embodiment of a substrate with isolation regions, first dielectric layer, and first metal layer.

FIG. 5 is a diagram illustrating a cross-section of one embodiment of substrate 42 with isolation regions 44, first dielectric layer 54a, and first metal layer 56a. First metal layer 56a includes TiN, HfN, TaN, ZrN, LaN, or other suitable material. First metal layer 56a is deposited on first dielectric layer 54a using ALD, MOCVD, PVD, JVD, or other suitable deposition technique. In one embodiment, first metal layer 56a has a thickness within the range of 1 Å to 50 Å.

Figure 6:
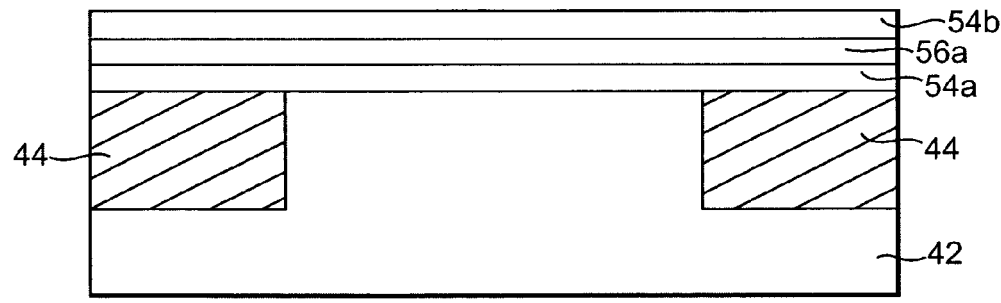
FIG. 6 is a diagram illustrating a cross-section of one embodiment of a substrate with isolation regions, first dielectric layer, first metal layer, and second dielectric layer.

FIG. 6 is a diagram illustrating a cross-section of one embodiment of substrate 42 with isolation regions 44, first dielectric layer 54a, first metal layer 56a, and second dielectric layer 54b. Second dielectric layer 54b is deposited on first metal layer 56a using ALD, MOCVD, PVD, JVD, or other suitable deposition technique. Second dielectric layer 54b comprises one or more high-k materials or a mixture of one or more high-k materials and their nitrided forms as described with reference to first dielectric layer 54a. In one embodiment, second dielectric layer 54b has a thickness within the range of 1 Å to 50 Å.

Figure 7:
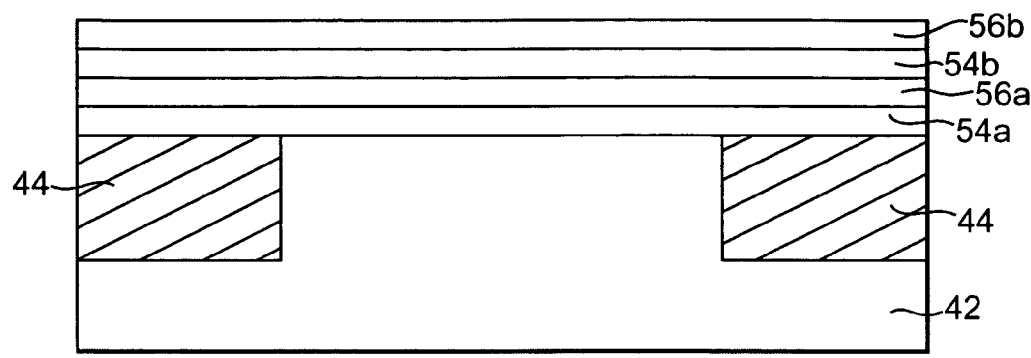
FIG. 7 is a diagram illustrating a cross-section of one embodiment of a substrate with isolation regions, first dielectric layer, first metal layer, second dielectric layer, and second metal layer.

FIG. 7 is a diagram illustrating a cross-section of one embodiment of substrate 42 with isolation regions 44, first dielectric layer 54a, first metal layer 56a, second dielectric layer 54b, and second metal layer 56b. Second metal layer 56b includes TiN, HfN, TaN, ZrN, LaN, or other suitable material. Second metal layer 56b is deposited on second dielectric layer 54b using ALD, MOCVD, PVD, JVD, or other suitable deposition technique. In one embodiment, second metal layer 56b has a thickness within the range of 1 Å to 50 Å.

Figure 8A:
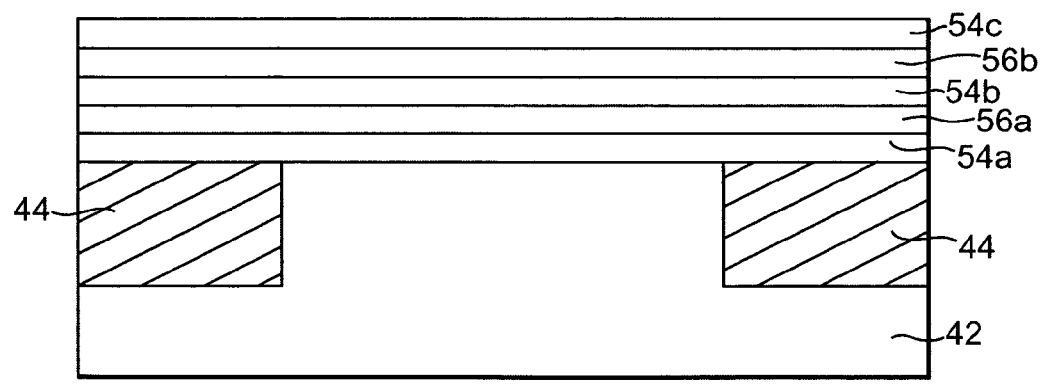
FIG. 8a is a diagram illustrating a cross-section of one embodiment of a substrate with isolation regions, first and second dielectric layers, first and second metal layers, and a third dielectric layer.

FIG. 8a is a diagram illustrating a cross-section of one embodiment of substrate 42 with isolation regions 44, first dielectric layer 54a, second dielectric layer 54b, first metal layer 56a, second metal layer 56b, and third dielectric layer 54c. Third dielectric layer 54c is deposited on second metal layer 56b using ALD, MOCVD, PVD, JVD, or other suitable deposition technique. Third dielectric layer 54c comprises one or more high-k materials or a mixture of one or more high-k materials and their nitrided forms as described with reference to first dielectric layer 54a. In one embodiment, third dielectric layer 54c has a thickness within the range of 1 Å to 50 Å.

Figure 8B:
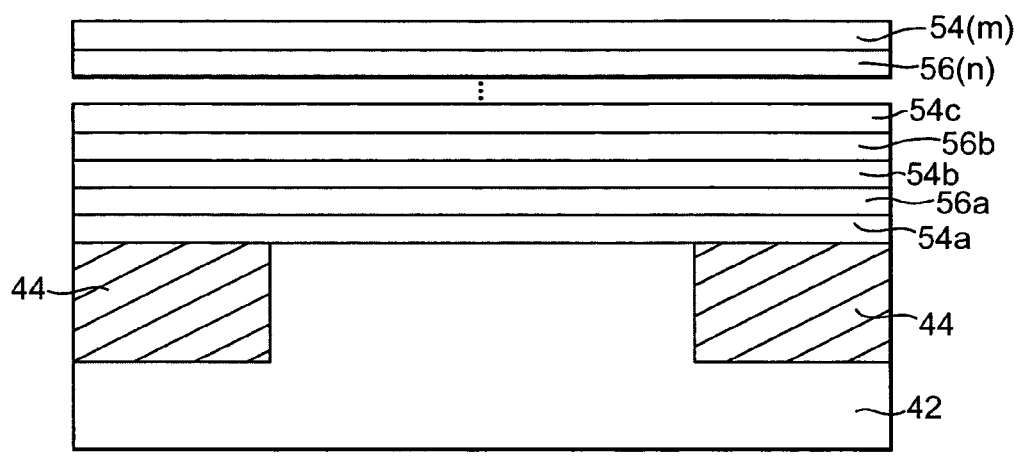
FIG. 8b is a diagram illustrating a cross-section of one embodiment of a substrate with isolation regions and repeating dielectric and metal layers.

FIG. 8b is a diagram illustrating a cross-section of one embodiment of repeating dielectric layers 54a–54(m), where m equals a number greater than one, and metal layers 56a–56(n), where n equals one or a number greater than one. Any desired number, m, of dielectric layers 54 and n (m−1) metal layers 56 can be deposited on substrate 42. Each dielectric layer 54a–54(m) can include one or more high-k materials or a mixture of one or more high-k materials and their nitrided forms as described with reference to first dielectric layer 54a. In one embodiment, each dielectric layer 54 includes the same high-k material or mixture. In another embodiment, each dielectric layer 54 includes a different high-k material or mixture. Each metal layer 56a–56(n) includes TiN, HfN, TaN, ZrN, LaN, or other suitable material. Each dielectric layer 54a–54(m) and each metal layer 56a–56(n) is deposited using ALD, MOCVD, PVD, JVD, or other suitable deposition technique on the previously deposited layer. In one embodiment, the combined thickness of dielectric layers 54a–54(m) and metal layers 56a–56(n) is within the range of 20 Å to 500 Å.

In one embodiment, dielectric layers 54a–54(m) and metal layers 56a–56(n) are annealed to partially oxide metal layers 56a–56(n). If one or more of metal layers 56a–56(n) comprise one or more of TiN, HfN, TaN, ZrN, and LaN, the partial oxidation process incorporates N into adjacent dielectric layers 54.

Figure 9:
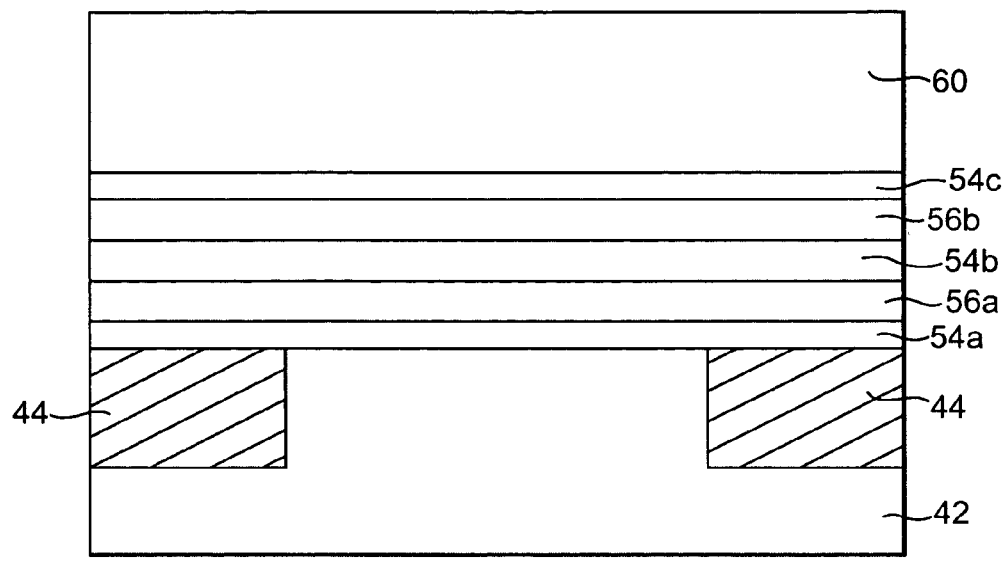
FIG. 9 is a diagram illustrating a cross-section of one embodiment of a substrate with isolation regions, first, second, and third dielectric layers, first and second metal layers, and gate electrode layer.

FIG. 9 is a diagram illustrating a cross-section of one embodiment of substrate 42 with isolation regions 44, dielectric layers 54, metal layers 56, and control gate electrode layer 60. Control gate electrode layer 60 comprises aluminum, polysilicon, or other suitable conductive material. Control gate electrode layer 60 is deposited on dielectric layer 54c (or dielectric layer 54(m) in FIG. 8) using CVD or other suitable deposition technique.

Figure 10:
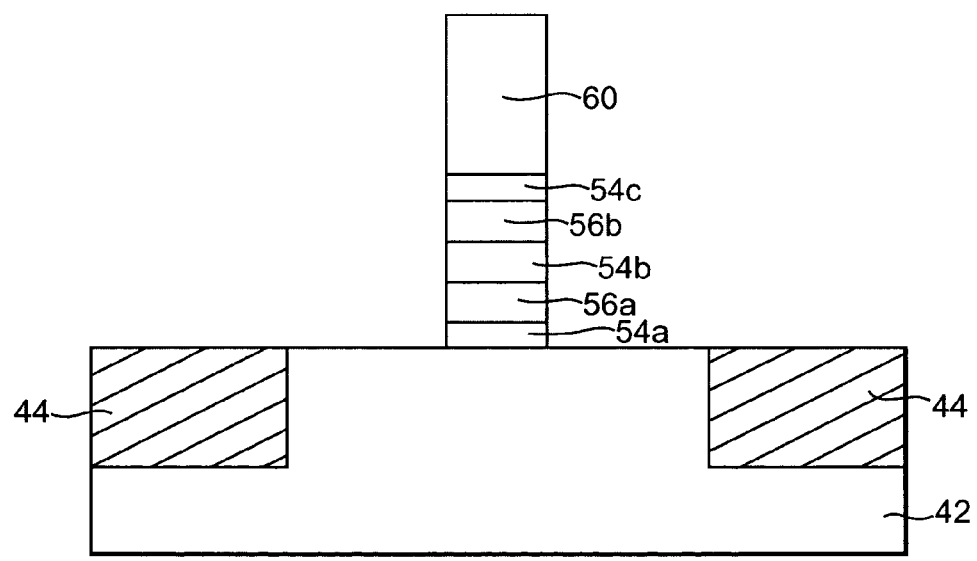
FIG. 10 is a diagram illustrating a cross-section of one embodiment of a substrate with isolation regions, first, second, and third dielectric layers, first and second metal layers, and gate electrode layer after etching.

FIG. 10 is a diagram illustrating a cross-section of one embodiment of substrate 42 with isolation regions 44, dielectric layers 54, metal layers 56, and control gate electrode layer 60 after portions of control gate electrode layer 60, dielectric layers 54, and metal layers 56 have been etched away. A photoresist and etching process is used to remove the unwanted portions.

Figure 11:
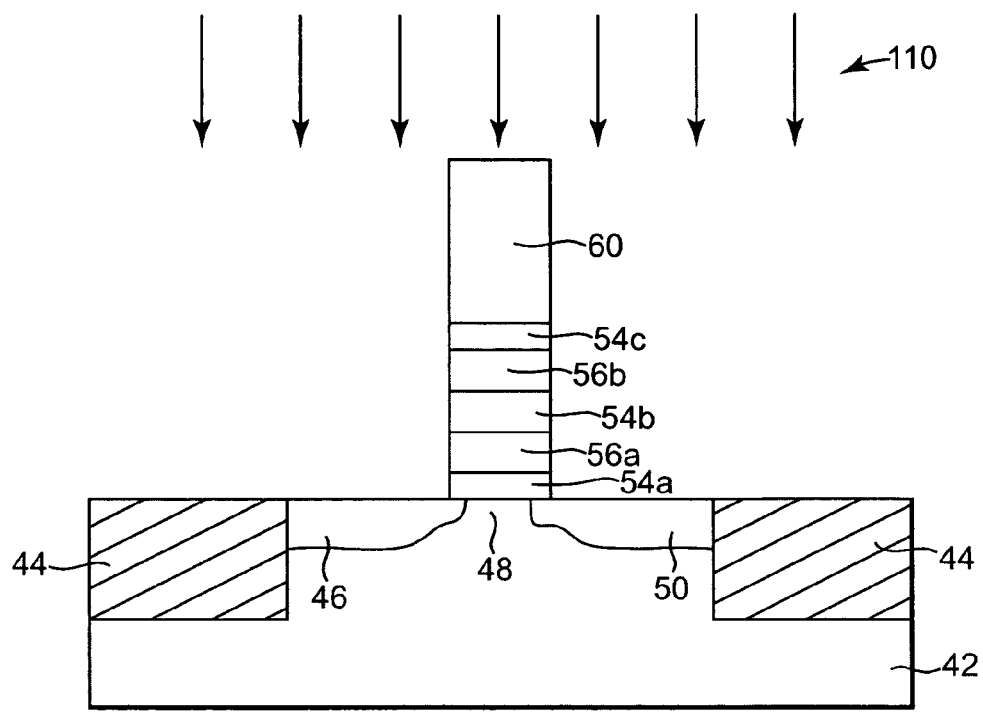
FIG. 11 is a diagram illustrating one embodiment of implantation of a cross-section of the substrate to form source and drain extension regions.

FIG. 11 is a diagram illustrating a cross-section of one embodiment of ion implantation 110 in a self-aligned process to form source extension region 46 and drain extension region 50. Substrate 42 is implanted with a species to form source extension region 46 and drain extension region 50. The implant species can include arsenic, phosphorous, boron, or other suitable species based upon the desired characteristics of memory cell 40.

Figure 12:
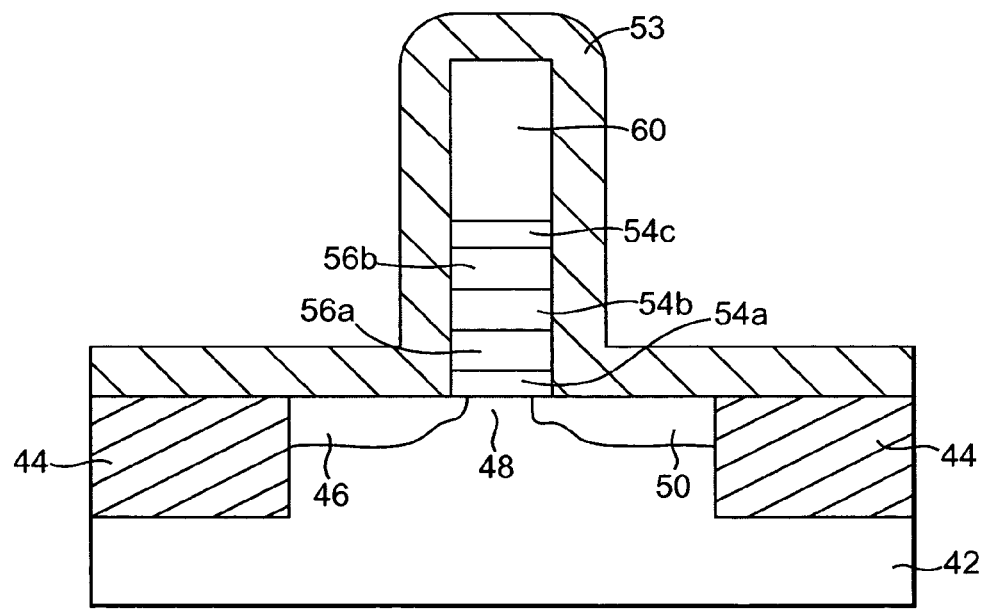
FIG. 12 is a diagram illustrating a cross-section of one embodiment of an oxide layer on a substrate with isolation regions, first, second, and third dielectric layers, first and second metal layers, and gate electrode layer.

FIG. 12 is a diagram illustrating a cross-section of one embodiment of substrate 42 with isolation regions 44, dielectric layers 54, metal layers 56, control gate electrode layer 60, and oxide layer 53. Oxide layer 53 is deposited on control gate electrode layer 60, the sides of dielectric layers 54, metal layers 56, and on substrate 42. Oxide layer 53 includes $SiO_2$ or other suitable material. Oxide layer 53 is deposited using CVD or other suitable deposition technique.

Figure 13:
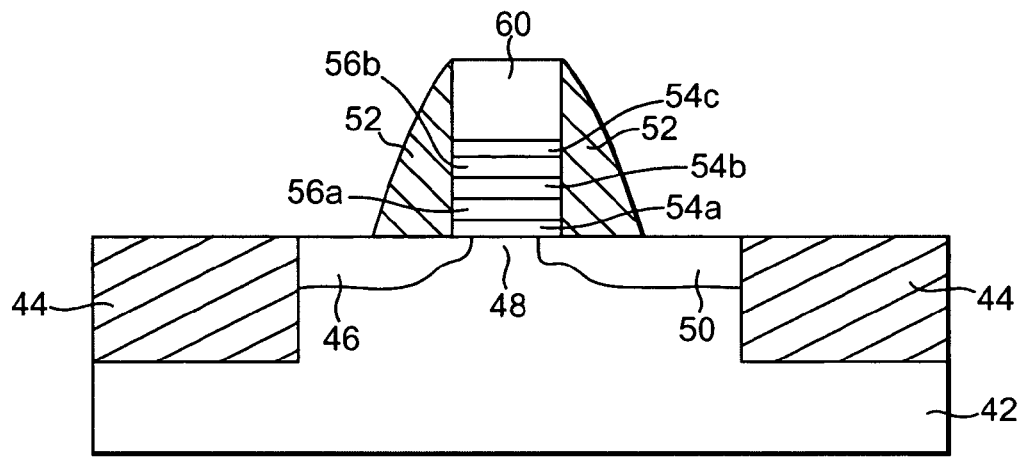
FIG. 13 is a diagram illustrating a cross-section of one embodiment of an oxide layer on a substrate with isolation regions, first, second, and third dielectric layers, first and second metal layers, and gate electrode layer after etching the oxide layer to form spacers.

FIG. 13 is a diagram illustrating a cross-section of one embodiment of substrate 42 with isolation regions 44, dielectric layers 54, metal layers 56, control gate electrode layer 60, and oxide layer 53 after etching to form spacers 52. A photoresist and etching process is used to remove unwanted portions of oxide layer 53 to form spacers 52.

Figure 14:
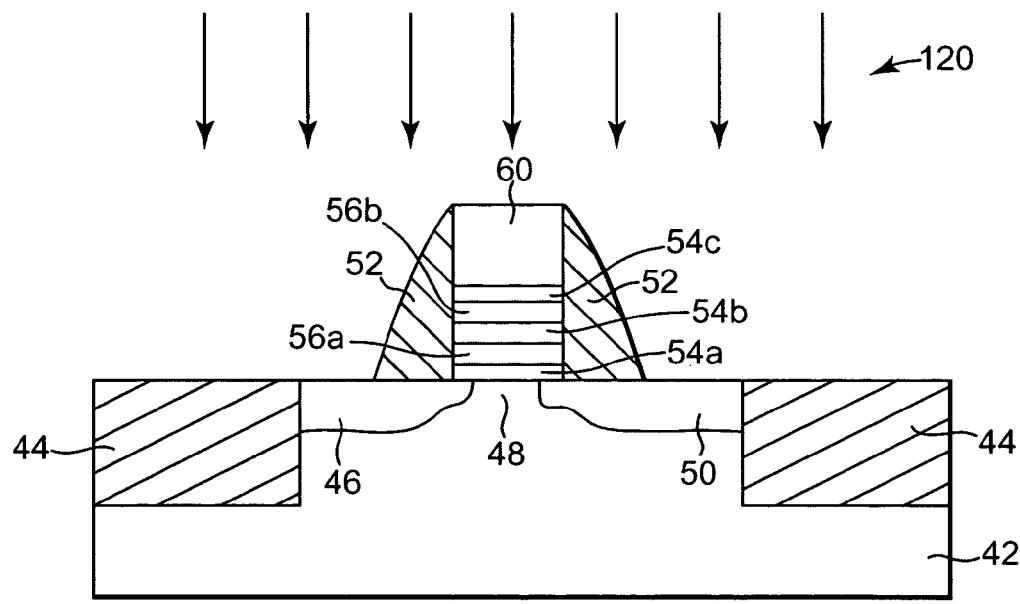
FIG. 14 is a diagram illustrating one embodiment of implantation of a cross-section of the substrate to form source and drain regions.

FIG. 14 is a diagram illustrating one embodiment of ion implantation 120 of a cross-section of substrate 42 to form source 46 and drain 50. Substrate 42 is implanted with a species to form source 46 and drain 50. The implant species can include arsenic, phosphorous, boron, or other suitable species based upon the desired characteristics of memory cell 40.

What is claimed is:

1. A memory device comprising:
   a substrate including isolation regions and active regions;
   a floating gate stack proximate the substrate, the floating gate stack comprising:
      a first high-k dielectric layer proximate the substrate;
      a first metal layer proximate the first high-k dielectric layer;
      a second high-k dielectric layer proximate the first metal layer;
      a second metal layer proximate the second high-k dielectric layer; and
      a third high-k dielectric layer proximate the second metal layer; and
   a control gate electrode proximate the floating gate stack.

2. The memory device of claim 1, wherein the floating gate stack further comprises:
   a third metal layer proximate the third high-k dielectric layer; and
   a fourth high-k dielectric layer proximate the third metal layer.

3. The memory device of claim 1, wherein the second high-k dielectric layer comprises at least one of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, and PMN.

4. The memory device of claim 3, wherein the second high-k dielectric layer is incorporated with N.

5. The memory device of claim 3, wherein the second high-k dielectric layer comprises a mixture comprising at least one of TiN, HfN, TaN, ZrN, and LaN.

6. The memory device of claim 1, wherein the first high-k dielectric layer has a thickness within a range of 1 Å to 50 Å.

7. The memory device of claim 1, wherein the first metal layer comprises one of TiN, HfN, TaN, ZrN, and LaN.

8. The memory device of claim 1, wherein the first metal layer has a thickness within a range of 1 Å to 50 Å.

9. The memory device of claim 1, wherein the first high-k dielectric layer and the second high-k dielectric layer comprise similar materials.

10. The memory device of claim 1, wherein the first high-k dielectric layer and the second high-k dielectric layer comprise different materials.

11. The memory device of claim 1, wherein the floating gate stack has a thickness within a range of 20 Å to 500 Å.

12. The memory device of claim 1, wherein the first metal layer is partially oxidized and the first high-k dielectric layer and the second high-k dielectric layer are incorporated with N from the oxidation.

13. An electrically-erasable programmable read-only memory comprising:
   a plurality of memory cells formed on a substrate, each memory cell comprising:
      isolation regions and active regions in the substrate;
      a floating gate stack proximate the substrate, the floating gate stack comprising:
         a first high-k material layer proximate the substrate;
         a first metal floating gate electrode proximate the first high-k material layer;
         a second high-k material layer proximate the first metal floating gate electrode;
         a second metal floating gate electrode proximate the second high-k material layer; and
         a third high-k material layer proximate the second metal floating gate electrode; and
      a control gate electrode proximate the floating gate stack.

14. The memory of claim 13, wherein the first high-k material layer and the second high-k material layer comprise similar high-k materials.

15. The memory of claim 13, wherein the first high-k material layer and the second high-k material layer comprise different high-k materials.

16. The memory of claim 13, wherein the first high-k material layer comprises one of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, and PMN.

17. The memory of claim 16, wherein the first high-k material layer comprises a mixture of at least two of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, and PMN.

18. The memory of claim 16, wherein the first high-k material layer comprises a mixture comprising at least one of TiN, HfN, TaN, ZrN, and LaN.

19. The memory of claim 16, wherein the second high-k material layer comprises one of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_{O2}$, $Bi_4Si_2O_{12}$, $WO_3$, $Y_2O_3$, $LaAlO_3$, BST, PST, PZN, PZT, and PMN.

20. The memory of claim 19, wherein the third high-k material layer comprises one of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, and PMN.

21. The memory of claim 13, wherein the first metal floating gate electrode comprises one of TiN, HfN, TaN, ZrN, and LaN.

22. The memory of claim 21, wherein the second metal floating gate electrode comprises one of TiN, HfN, TaN, ZrN, and LaN.

23. A method of making a memory device, the method comprising:
   forming isolation regions, well regions, and active regions on a substrate;
   depositing a first high-k material layer on the substrate;
   depositing a first metal layer on the first high-k material layer;
   depositing a second high-k layer material layer on the first metal layer;
   depositing a second metal layer on the second high-k material layer; and
   depositing a third high-k material layer on the second metal layer.

24. The method of claim 23, wherein depositing the second high-k dielectric layer comprises simultaneously depositing at least two of $Si_3N_4$, $Al_2O_3$, $Ta_2O_5$, $HfO_2$, $TiO_2$, $HfSiO_x$, $Zro_2$, $ZrSiO$, $La_2O_3$, $CeO_2$, $Bi_4Si_2O_{12}$, $WO_3$, $Y_2O_3$, $LaAlO_3$, BST, PST, PZN, PZT, PMN, TiN, HfN, TaN, ZrN, and LaN.

25. The method of claim 23, further comprising:
annealing the substrate, the first high-k material layer, the first metal layer, the second high-k material layer, the second metal layer, and the third high-k material layer to partially oxidize the first metal layer and the second metal layer.

26. The method of claim 25, further comprising:
depositing a gate electrode material layer on the third high-k material layer.

27. The method of claim 23, further comprising:
depositing a third metal layer on the third high-k material layer; and
depositing a fourth high-k material layer on the third metal layer.

28. The method of claim 23, wherein the first high-k material layer is deposited using atomic layer deposition.

29. The method of claim 23, wherein the first high-k material layer is deposited using one of metal-organic chemical vapor deposition, plasma vapor deposition, and jet vapor deposition.

30. The method of claim 23, wherein the first metal layer is deposited using atomic layer deposition.

31. The method of claim 23, wherein the first metal layer is deposited using one of metal-organic chemical vapor deposition, plasma vapor deposition, and jet vapor deposition.

32. The method of claim 27, further comprising:
depositing a gate electrode material layer on the fourth high-k material layer.

33. The method of claim 23, wherein depositing the first high-k dielectric material layer comprises depositing at least one of $Si_3N_4$, $Al_2O_3$, $Ta_2O_5$, $HfO_2$, $TiO_2$, $HfSiO_x$, $ZrO_2$, $ZrSiO_x$, $La_2O_3$, $CeO_2$, $Bi_4Si_2O_{12}$, $WO_3$, $Y_2O_3$, $LaAlO_3$, BST, PST, PZN, PZT, and PMN.

34. The method of claim 23, wherein depositing the first metal layer comprises depositing at least one of TiN, HfN, TaN, ZrN, and LaN.

35. The method of claim 34, further comprising:
annealing the substrate, the first high-k material layer, the first metal layer, the second high-k material layer, the second metal layer, and the third high-k material layer to partially oxidize the first metal layer and the second metal layer to incorporate N into the first high-k material layer, the second high-k material layer, and the third high-k material layer.

36. A flash memory device comprising:
a plurality of memory cells formed on a substrate, each memory cell comprising:
isolation regions and active regions in the substrate;
a floating gate stack proximate the substrate, the floating gate stack comprising:
a first high-k material layer proximate the substrate;
a first metal floating gate electrode proximate the first high-k material layer;
a second high-k material layer proximate the first metal floating gate electrode;
a second metal floating gate electrode proximate the second high-k material layer; and
a third high-k material layer proximate the second metal floating gate electrode; and
a control gate electrode proximate the floating gate stack.

* * * * *

UNITED STATES PATENT AND TRADEMARK OFFICE
CERTIFICATE OF CORRECTION

PATENT NO.        : 7,138,680 B2
APPLICATION NO. : 10/940513
DATED             : November 21, 2006
INVENTOR(S)       : Hong-Jyh Li et al.

It is certified that error appears in the above-identified patent and that said Letters Patent is hereby corrected as shown below:

On the title page item (73), should read:

Infineon Technologies AG, Munich, Germany

Advanced Micro Devices, Inc., Sunnyvale, California

Signed and Sealed this

Third Day of November, 2009

David J. Kappos
*Director of the United States Patent and Trademark Office*